(12) United States Patent
Dai

(10) Patent No.: US 6,753,203 B1
(45) Date of Patent: Jun. 22, 2004

(54) METHOD FOR MANUFACTURING AN IMAGE SENSOR

(75) Inventor: Ken Dai, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 0 days.

(21) Appl. No.: 10/447,431

(22) Filed: May 28, 2003

(51) Int. Cl.[7] .............................................. H01L 21/44
(52) U.S. Cl. ........................ 438/106; 438/115; 438/116
(58) Field of Search ................................. 438/106–126

(56) References Cited

U.S. PATENT DOCUMENTS 4,426,769 A * 1/1984 Grabbe ........................ 29/832

* cited by examiner

*Primary Examiner*—H. Jey Tsai
(74) *Attorney, Agent, or Firm*—Pro-Techtor International Services

(57) ABSTRACT

A method for manufacturing an image sensor includes the steps of: providing a substrate having an upper surface and a lower surface; mounting a frame layer to the upper surface of the substrate to form a cavity together with the substrate; mounting a photosensitive chip to the upper surface of the substrate and within the cavity; providing a plurality of wires to electrically connect the photosensitive chip to the substrate; supplying an adhesive layer to the upper surface of the substrate and within the cavity; mounting a transparent layer to the frame layer to cover the photosensitive chip; and illuminating an electrostatic-charge eliminating light source on the transparent layer to let particles within the cavity fall down to the adhesive layer.

3 Claims, 1 Drawing Sheet

METHOD FOR MANUFACTURING AN IMAGE SENSOR

BACKGROUND OF THE INVENTION

1. Field of the Invention

The invention relates to a method for manufacturing an image sensor, and in particular to a method capable of manufacturing an image sensor having fewer particles on a photosensitive chip or a transparent layer and having improved quality.

2. Description of the Related Art

A general sensor is used to sense signals, which may be optical or audio signals. The sensor of the invention is used to receive image signals or optical signals. After receiving the image signals, the sensor converts the image signals into electrical signals, which are then transmitted to a printed circuit board via a substrate.

Referring to FIG. 1, a conventional image sensor includes a substrate 10, a frame layer 18, a photosensitive chip 26, a plurality of wires 28, and a transparent layer 34. The substrate 10 has an upper surface 12 on which first connection points 15 are formed, and a lower surface 14 on which second connection points 16 are formed. The frame layer 18 has a first surface 20 and a second surface 22 adhered to the upper surface 12 of the substrate 10 to form a cavity 24 together with the substrate 10. The photosensitive chip 26 is arranged within the cavity 24 and is mounted to the upper surface 12 of the substrate 10. Each wire 28 has a first terminal 30 and a second terminal 32. The first terminals 30 are electrically connected to the photosensitive chip 26, and the second terminals 32 are electrically connected to the first connection points 15 of the substrate 10. The transparent layer 34 is adhered to the first surface 20 of the frame layer 18.

In the image sensor, however, even if the transparent layer 34 and the photosensitive chip 26 are cleaned before the packaging process, some particles may be attracted to the transparent layer 34 and the photosensitive chip 26 owing to electrostatic charges, and the image sensor quality may be influenced accordingly.

SUMMARY OF THE INVENTION

An object of the invention is to provide a method for packaging an image sensor capable of eliminating electrostatic charges within the image sensor and preventing particles from being attracted to the photosensitive chip.

Another object of the invention is to provide a method for manufacturing an image sensor capable of adhering particles to an adhesive layer without influencing the image sensor quality.

To achieve the above-mentioned objects, the invention provides a method for manufacturing an image sensor including the steps of: providing a substrate having an upper surface and a lower surface; mounting a frame layer to the upper surface of the substrate to form a cavity together with the substrate; mounting a photosensitive chip to the upper surface of the substrate and within the cavity; providing a plurality of wires to electrically connect the photosensitive chip to the substrate; supplying an adhesive layer to the upper surface of the substrate and within the cavity; mounting a transparent layer to the frame layer to cover the photosensitive chip; and illuminating an electrostatic-charge eliminating light source on the transparent layer to let particles within the cavity fall down to the adhesive layer. Consequently, the particles may fall down to the adhesive layer, and it is possible to prevent the particles from being attracted to the photosensitive chip or the transparent layer and to prevent the particles from influencing the image sensor quality.

DETAILED DESCRIPTION OF THE INVENTION

Figure 1:
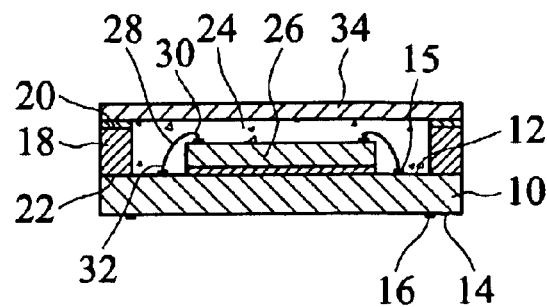
FIG. 1 shows a conventional image sensor.
Figure 2:
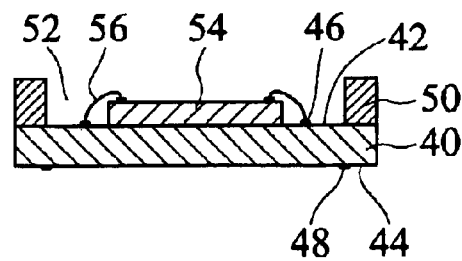
FIG. 2 is a first schematic illustration showing a method for manufacturing an image sensor of the invention.

Referring to FIG. 2, a method for manufacturing an image sensor of the invention includes the steps of:

providing a substrate 40 having an upper surface 42 formed with a plurality of first connection points 46 and a lower surface 44 formed with a plurality of second connection points 48;

mounting a frame layer 50 to the upper surface 42 of the substrate 40 to form a cavity 52 together with the substrate 40;

mounting a photosensitive chip 54 to the upper surface 42 of the substrate 40 and within the cavity 52; and providing a plurality of wires 56 to electrically connect the photosensitive chip 54 to the first connection points 46 of the substrate 40.

Figure 3:
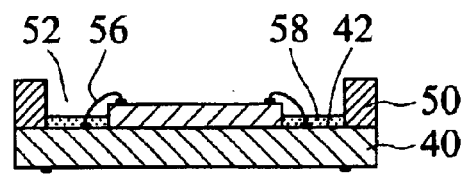
FIG. 3 is a second schematic illustration showing the method for manufacturing the image sensor of the invention.
Figure 4:
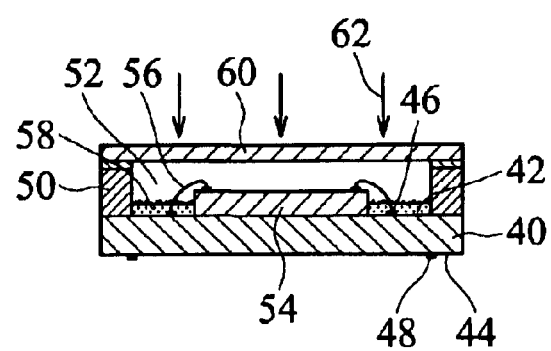
FIG. 4 is a third schematic illustration showing the method for manufacturing the image sensor of the invention.

Referring to FIG. 3, the method for manufacturing the image sensor of the invention further includes the step of supplying an adhesive layer 58 to the upper surface 42 of the substrate 40 and within the cavity 52. In this embodiment, the adhesive layer 58 may be applied or coated to the upper surface 42 of the substrate 40 by way of coating or spraying.

Referring to FIG. 3, the method for manufacturing the image sensor of the invention further includes the steps of:

mounting a transparent layer 60, which may be a piece of transparent glass, to the frame layer 50 in order to cover the photosensitive chip 54; and providing an electrostatic charge eliminator above the transparent layer 60 to generate an electrostatic-charge eliminating light source 62 on the transparent layer 60 so as to eliminate electrostatic charges within the packaged image sensor. Thus, the particles within the cavity 52 (particles on the transparent layer 60 and the photosensitive chip 54) will no longer be attracted to the photosensitive chip and the transparent layer by the electrostatic charges and will fall down to the adhesive layer 58 and be adhered to the adhesive layer 58. The quality of the image sensor will be improved because no particle may influence the received image signals.

While the invention has been described by way of an example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. A method for manufacturing an image sensor, comprising the steps of:

providing a substrate having an upper surface and a lower surface;

mounting a frame layer to the upper surface of the substrate to form a cavity together with the substrate;

mounting a photosensitive chip to the upper surface of the substrate and within the cavity;

providing a plurality of wires to electrically connect the photosensitive chip to the substrate;

supplying an adhesive layer to the upper surface of the substrate and within the cavity;

mounting a transparent layer to the frame layer to cover the photosensitive chip; and illuminating an electrostatic-charge eliminating light source on the transparent layer to let particles within the cavity fall down to the adhesive layer.

2. The method according to claim 1, wherein the transparent layer is a piece of transparent glass.

3. The method according to claim 1, wherein the electrostatic-charge eliminating light source is illuminated from an electrostatic charge eliminator.

* * * * *